(12) United States Patent
Werkman et al.

(10) Patent No.: US 11,669,017 B2
(45) Date of Patent: Jun. 6, 2023

(54) METHOD FOR CONTROLLING A MANUFACTURING APPARATUS AND ASSOCIATED APPARATUSES

(71) Applicant: ASML NETHERLANDS B.V., Veldhoven (NL)

(72) Inventors: Roy Werkman, Eindhoven (NL); Bijoy Rajasekharan, Eindhoven (NL); Lydia Marianna Vergaij-Huizer, Eindhoven (NL); Jochem Sebastiaan Wildenberg, Aarle-Rixtel (NL); Ronald Van Ittersum, Tilburg (NL); Pieter Gerardus Jacobus Smorenberg, Rotterdam (NL); Robertus Wilhelmus Van Der Heijden, Tilburg (NL); Xiuhong Wei, Eindhoven (NL); Hadi Yagubizade, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 16/762,982

(22) PCT Filed: Nov. 9, 2018

(86) PCT No.: PCT/EP2018/080708
§ 371 (c)(1),
(2) Date: May 11, 2020

(87) PCT Pub. No.: WO2019/110238
PCT Pub. Date: Jun. 13, 2019

(65) Prior Publication Data
US 2020/0278614 A1 Sep. 3, 2020

(30) Foreign Application Priority Data

Dec. 7, 2017 (EP) .................................. 17205900

(51) Int. Cl.
*G03F 7/20* (2006.01)

(52) U.S. Cl.
CPC ...... *G03F 7/70458* (2013.01); *G03F 7/70616* (2013.01)

(58) Field of Classification Search
CPC ............. G03F 7/70458; G03F 7/70525; G03F 7/70616
See application file for complete search history.

(56) References Cited

U.S. PATENT DOCUMENTS 8,867,018 B2 * 10/2014 Lu .......................... G03B 27/32
355/52
11,422,455 B2 * 8/2022 Lee ..................... G03F 7/70033
(Continued)

FOREIGN PATENT DOCUMENTS

| JP | 2012204833 | 10/2012 |
| WO | 2009078708 | 6/2009 |

(Continued)

OTHER PUBLICATIONS

International Search Report and Written Opinion issued in corresponding PCT Patent Application No. PCT/EP2018/080708, dated Feb. 27, 2019.
(Continued)

*Primary Examiner* — Deoram Persaud
(74) *Attorney, Agent, or Firm* — Pillsbury Winthrop Shaw Pittman, LLP

(57) ABSTRACT

A method for determining a plurality of corrections for control of at least one manufacturing apparatus used in a manufacturing process for providing product structures to a substrate in a plurality of layers, the method including: determining the plurality of corrections including a correction for each layer, based on an actuation potential of the applicable manufacturing apparatus used in the formation of
(Continued)

US 11,669,017 B2

Page 2 each layer, wherein the determining includes determining corrections for each layer simultaneously in terms of a matching parameter.

20 Claims, 5 Drawing Sheets

(56) References Cited

U.S. PATENT DOCUMENTS

| | | |
|---|---|---|
| 2002/0111038 A1 | 8/2002 | Matsumoto et al. |
| 2006/0006685 A1 | 1/2006 | Shibukawa et al. |
| 2006/0033921 A1 | 2/2006 | Den Boef et al. |
| 2006/0066855 A1 | 3/2006 | Den Boef et al. |
| 2008/0294280 A1 | 11/2008 | Okita |
| 2009/0168034 A1 | 7/2009 | Steacker et al. |
| 2010/0073656 A1 | 3/2010 | Imaoka |
| 2010/0201963 A1 | 8/2010 | Cramer et al. |
| 2010/0233599 A1 | 9/2010 | Hinnen et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2011/0130860 A1* | 6/2011 | Kelley .................. H05K 3/4638 700/121 |
| 2011/0205520 A1* | 8/2011 | Padiy .................. G03F 7/70516 355/72 |
| 2012/0044470 A1 | 2/2012 | Smilde et al. |
| 2012/0123581 A1 | 5/2012 | Smilde et al. |
| 2012/0244461 A1 | 9/2012 | Nagai |
| 2013/0258310 A1 | 10/2013 | Smilde et al. |
| 2013/0271740 A1 | 10/2013 | Quintanilha |
| 2016/0313653 A1* | 10/2016 | Mink .................. G03F 7/70633 |
| 2018/0292761 A1* | 10/2018 | Cekli .................. G03F 7/70358 |
| 2019/0094710 A1* | 3/2019 | Wang .................. G03F 7/70441 |
| 2020/0110341 A1* | 4/2020 | Mossavat ............ G03F 7/70633 |
| 2021/0208511 A1* | 7/2021 | Tel ...................... G03F 7/70425 |
| 2021/0247700 A1* | 8/2021 | Siemons ............. G03F 7/70475 |

FOREIGN PATENT DOCUMENTS

| | | |
|---|---|---|
| WO | 2009106279 | 9/2009 |
| WO | 2013178422 | 12/2013 |

OTHER PUBLICATIONS

Korean Office Action issued in corresponding Korean Patent Application No. 10-2020-7016322, dated Jan. 5, 2022.

* cited by examiner

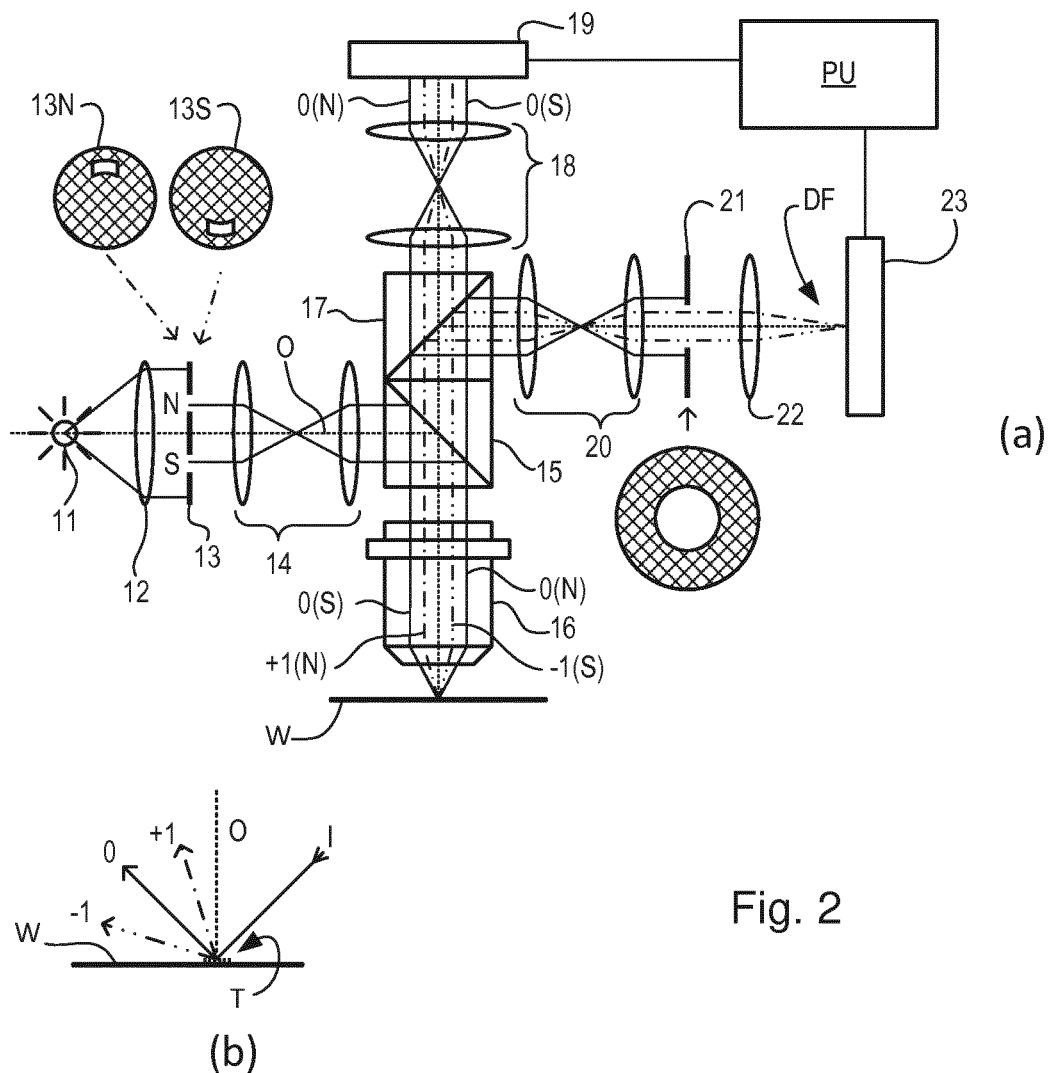
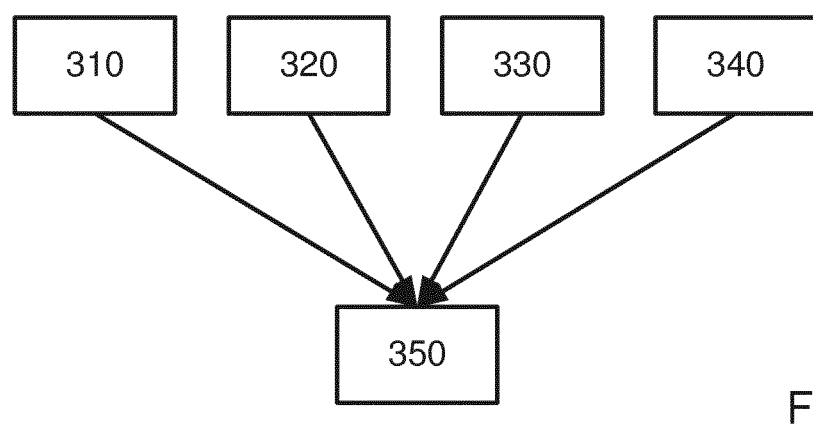
Fig. 2
Fig. 3

METHOD FOR CONTROLLING A MANUFACTURING APPARATUS AND ASSOCIATED APPARATUSES

CROSS-REFERENCE TO RELATED APPLICATIONS

This application is the U.S. national phase entry of PCT Patent Application No. PCT/EP2018/080708, which was filed on Nov. 9, 2018, which claims the benefit of priority of European Patent Application No. 17205900.8 which was filed on Dec. 7, 2017 and which is incorporated herein in its entirety by reference.

BACKGROUND

Field of the Invention

The present invention relates to methods and apparatus for applying patterns to a substrate in a lithographic process

Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In performing lithographic processes, such as application of a pattern on a substrate or measurement of such a pattern, process control methods are used to monitor and control the process. Such process control techniques are typically performed to obtain corrections for control of the lithographic process. It would be desirable to improve such process control methods.

SUMMARY OF THE INVENTION

In a first aspect of the invention, there is provided a method for determining a plurality of corrections for control of at least one manufacturing apparatus used in a manufacturing process for providing product structures to a substrate in a plurality of layers, the method comprising: determining the plurality of corrections comprising a correction for each layer, based on an actuation potential of the applicable manufacturing apparatus used in the formation of each layer, wherein said determining step comprises determining corrections for each layer simultaneously in terms of a matching parameter.

In a second aspect of the invention, there is provided a processing device for determining corrections for control of at least one manufacturing apparatus configured to provide product structures to a substrate in a plurality of layers in a manufacturing process, the processing device being configured to perform the method of the first aspect.

In a third aspect of the invention, there is provided a computer program comprising program instructions operable to perform the method of the first aspect when run on a suitable apparatus.

In a fourth aspect of the invention, there is provided a manufacturing apparatus configured to provide product structures to a substrate in a manufacturing process, said manufacturing apparatus comprising the processing device of the second aspect.

In a fifth aspect of the invention, there is provided a method for matching lithographic apparatuses comprising: obtaining a first non-correctable component associated with a first lithographic apparatus; obtaining a second non-correctable component associated with a second lithographic apparatus; and determining, based on the first non-correctable component and second non-correctable component, a matching indicator which characterizes a quality of processing using the first lithographic apparatus and the second lithographic apparatus Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which:

FIG. 2 comprises a schematic diagram of a scatterometer for use in measuring targets according to embodiments of the invention;

FIG. 3 shows exemplary sources of processing parameters;

DETAILED DESCRIPTION

Before describing embodiments of the invention in detail, it is instructive to present an example environment in which embodiments of the present invention may be implemented.

Figure 1:
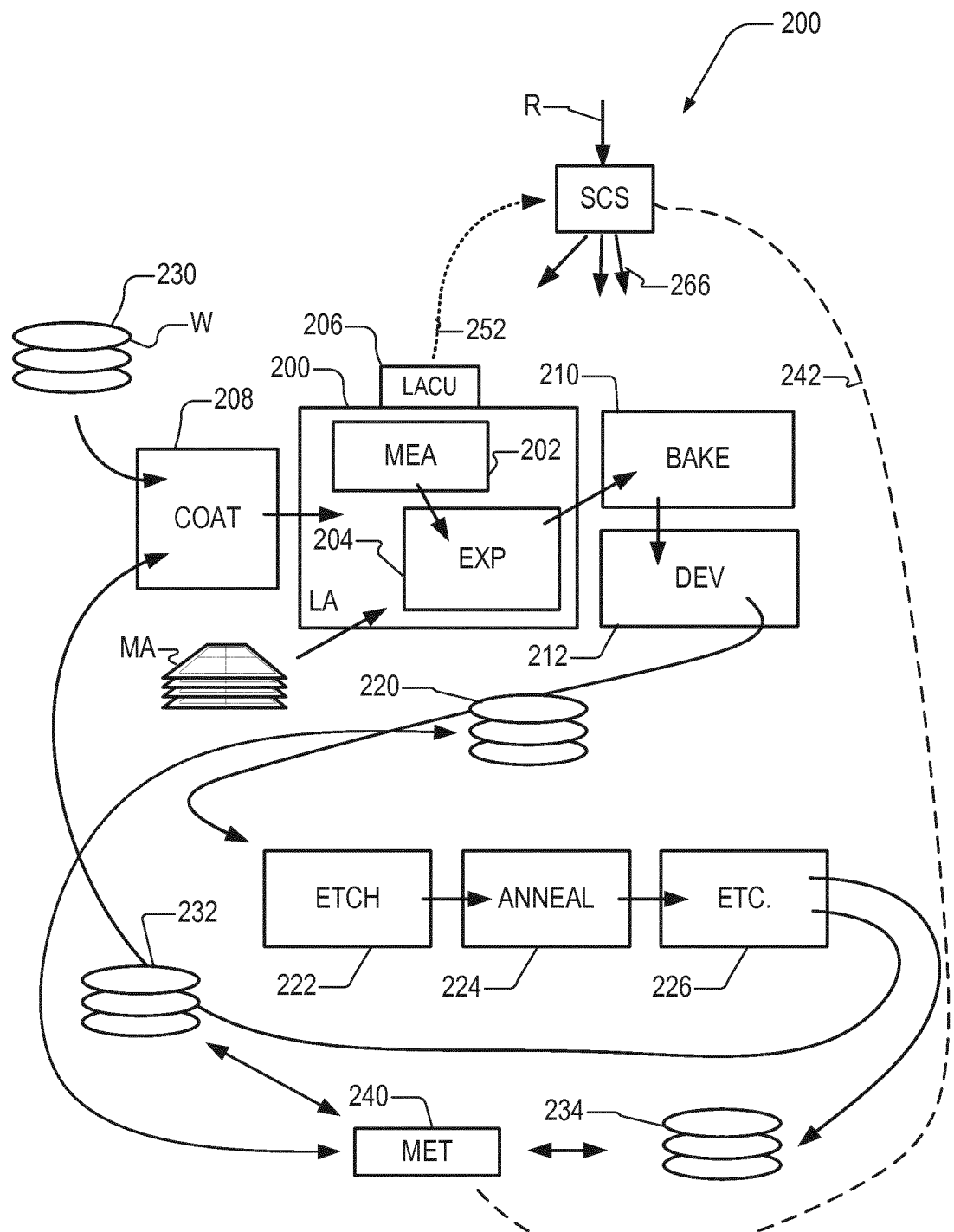
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

A metrology apparatus suitable for use in embodiments of the invention is shown in FIG. 2(a). A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for many measurement purposes such as reconstruction used in methods described herein. The pupil plane image can also be used for focusing the metrology apparatus and/or normalizing intensity measurements of the first order beam.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

The target T may comprise a number of gratings, which may have differently biased overlay offsets in order to facilitate measurement of overlay between the layers in which the different parts of the composite gratings are formed. The gratings may also differ in their orientation, so as to diffract incoming radiation in X and Y directions. In one example, a target may comprise two X-direction gratings with biased overlay offsets +d and −d, and Y-direction gratings with biased overlay offsets +d and −d. Separate images of these gratings can be identified in the image captured by sensor 23. Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process Various techniques may be used to improve the accuracy of reproduction of patterns onto a substrate. Accurate reproduction of patterns onto a substrate is not the only concern in the production of ICs. Another concern is the yield, which generally measures how many functional devices a device manufacturer or a device manufacturing process can produce per substrate. Various approaches can be employed to enhance the yield. One such approach attempts to make the production of devices (e.g., imaging a portion of a design layout onto a substrate using a lithographic apparatus such as a scanner) more tolerant to perturbations of at least one of the processing parameters during processing a substrate, e.g., during imaging of a portion of a design layout onto a substrate using a lithographic apparatus. The concept of a criticality metric such as a process window is a useful tool for this approach. The production of devices (e.g., ICs) may include other steps such as substrate measurements before, after or during imaging, loading or unloading of the substrate, loading or unloading of a patterning device, positioning of a die underneath the projection optics before exposure, stepping from one die to another, etc. Further, various patterns on a patterning device may have a process window (i.e., a space of processing parameters under which a pattern will be produced within specification). Examples of pattern specifications that relate to a potential systematic defect include checks for necking, line pull back, line thinning, CD, edge placement, overlapping, resist top loss, resist undercut and/or bridging. Additionally, the process window of all or some (usually patterns within a particular area) of the patterns on a patterning device may be obtained by merging (e.g., overlapping) process windows of each individual pattern to determine an overlapping process window (OPW). The process window of these patterns is thus called an overlapping process window. The boundary of the OPW may contain boundaries of process windows of some of the individual patterns. In another words, these individual patterns limit the OPW. These individual patterns can be referred to as "hot spots" or "process window limiting patterns (PWLPs)," which are used interchangeably herein. When controlling a lithography process, it is possible, and typically economical, to focus on the hot spots. When the hot spots are not defective, it is likely that all the patterns are not defective. The imaging becomes more tolerant to perturbations when values of the processing parameters are closer to the OPW if the values of the processing parameters are outside the OPW, or when the values of the processing parameters are farther away from the boundary of the OPW if the values of the processing parameters are inside the OPW.

FIG. 3 shows exemplary sources of processing parameters 350. One source may be data 310 of the processing apparatus, such as parameters of the source, projection optics, substrate stage, etc. of a lithography apparatus, of a track, etc. Another source may be data 320 from various substrate metrology tools, such as a substrate height map, a focus map, a critical dimension uniformity (CDU) map, etc. Data 320 may be obtained before the applicable substrate was subject to a step (e.g., development) that prevents reworking of the substrate. Another source may be data 330 from one or more patterning device metrology tools, patterning device CDU map, patterning device (e.g., mask) film stack parameter variation, etc. Yet another source may be data 340 from an operator of the processing apparatus.

Figure 4:
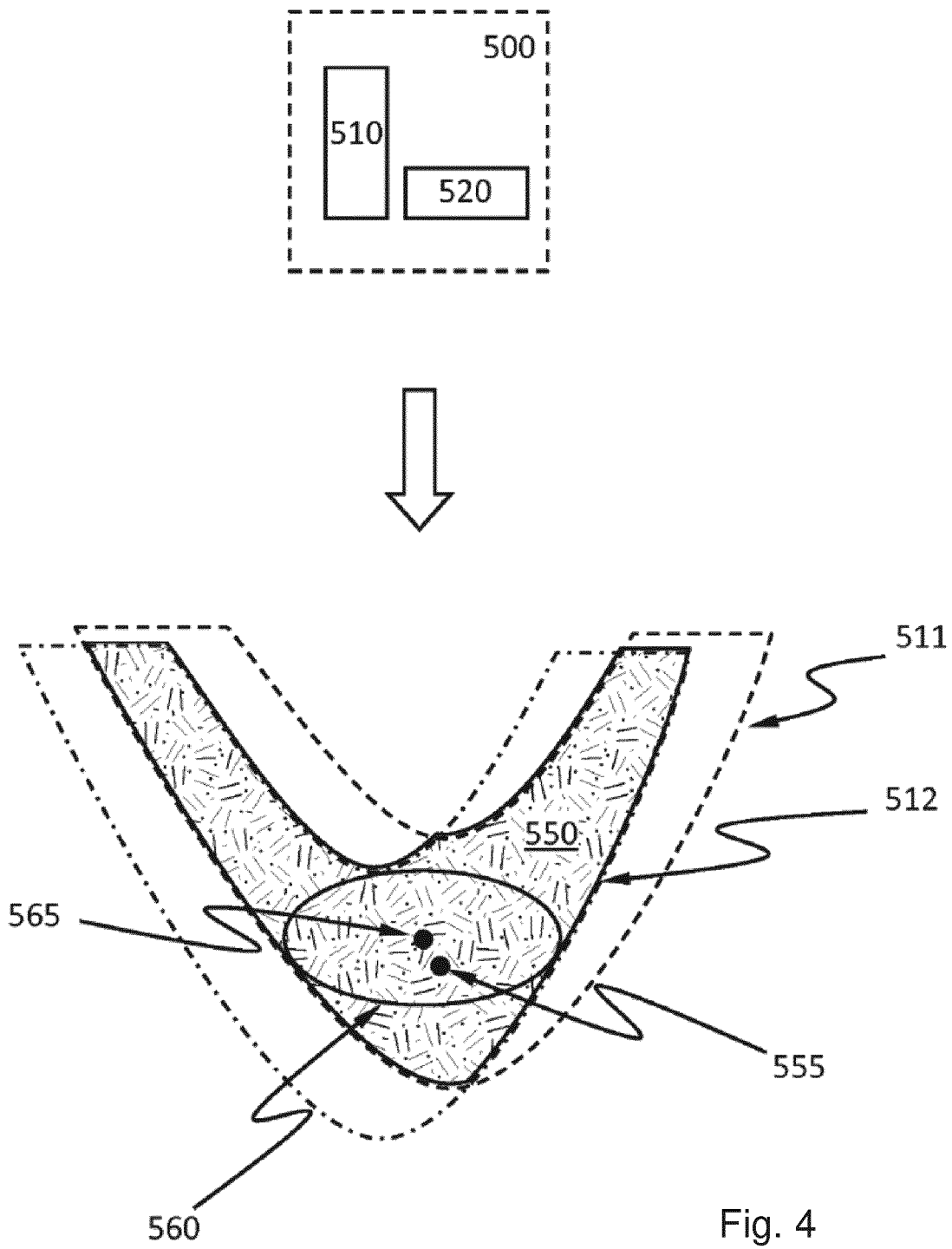
FIG. 4 schematically illustrates a concept of an overlapping process window (OPW)

FIG. 4 schematically illustrates the concept of an OPW. To illustrate the concept, an area, or grid element/pixel, 500 on the patterning device is assumed to have only two individual patterns 510 and 520. The area may include many more patterns. The process windows for the individual patterns 510 and 520 are 511 and 512, respectively. To illustrate the concept, the processing parameters are assumed to only include focus (horizontal axis) and dose (vertical axis). The processing parameters may however include any suitable parameters. The OPW 550 of the area can be obtained by finding the overlap between process windows 511 and 512. The OPW 550 is represented as the hatched area in FIG. 4. The OPW 550 can have an irregular shape. However, in order to easily represent the OPW and to easily determine whether a set of processing parameter values are within the OPW, a "fitted OPW" (e.g., ellipse 560) may be used instead. The "fitted OPW" can be, for example, the largest hyperellipsoid (e.g., ellipse in 2-dimensional processing parameter space as in this example, ellipsoid 3-dimensional processing parameter space, etc.) that fits inside the OPW. Using the "fitted OPW" tends to reduce the computational cost but does not take advantage of the full size of the OPW.

The values of the processing parameters may be selected such that they stay away from the boundary of the OPW or the fitted OPW, in order to decrease the chance that the processing parameters shift outside the OPW and thereby cause defects and decrease the yield. One approach of selecting the values of the processing parameters includes, before actual imaging, (1) optimizing the lithographic apparatus (e.g., optimizing the source and projection optics) and optimizing the design layout, (2) determining the OPW or fitted OPW (e.g., by simulation), and (3) determining a point in the space of the processing parameters (i.e., determining the values of the processing parameters) that is as far away as possible from the boundary of the OPW or fitted OPW (this point may be called the "center" of the OPW or fitted OPW). In the example of FIG. 4, point 555 is the point in the processing parameter space that is as far away as possible from the boundary of the OPW 550 and point 565 is the point in the processing parameter space that is as far away as possible from the boundary of the fitted OPW 560. Point 555 and point 565 may be referred to as the nominal condition. During or before imaging, if the processing parameters shift away from point 555 or point 565, towards the boundary of the OPW or even to the outside the boundary of the OPW, it would be beneficial to have the capability of realizing such a shift and to make appropriate corrections to put the processing parameters back into the OPW and away from its boundary, desirably without interrupting the imaging or other processing.

During or before the actual imaging, the processing parameters may have a perturbation that causes them to deviate from the point that is as far away as possible from the boundary of the OPW or fitted OPW. For example, the focus may change due to topography of a substrate to be exposed, drift in the substrate stage, deformation of the projection optics, etc.; the dose may change to due drift in the source intensity, dwell time, etc. The perturbation may be large enough to cause processing parameters to be outside the OPW, and thus may lead to defects. Various techniques may be used to identify a processing parameter that is perturbed and to correct that processing parameter. For example, if the focus is perturbed, e.g., because an area of the substrate that is slightly raised from the rest of the substrate is being exposed, the substrate stage may be moved or tilted to compensate for the perturbation.

Control of the lithographic process are typically based on measurements fed back or fed forward and then modelled using, for example interfield (across-substrate fingerprint) or intrafield (across-field fingerprint) models. Within a die, there may be separate functional areas such as memory areas, logic areas, contact areas etc. Each different functional area, or different functional area type may have a different process window, each with a different processes window center. For example, different functional area types may have different heights, and therefore different best focus settings. Also, different functional area types may have different structure complexities and therefore different focus tolerances (focus process windows) around each best focus. However, each of these different functional areas will typically be formed using the same focus (or dose or position etc.) setting due to control grid resolution limitations.

Normally, when performing layer-to-layer matching (e.g., of a matching parameter such as overlay, CD matching quality or edge placement error (EPE), corrections are determined on a per-layer basis, based on measurements of a previous layer. CD matching quality in this context describes the degree of matching of critical dimension (CD) of similar structures formed in different layers on a substrate. EPE in this context describes the combined error resultant from overlay and CD matching quality (and possibly other errors such as local and/or global CD uniformity). For example, the position or size of a first structure in a first (i.e., earlier applied) layer is measured and a correction is determined for implementation by the lithographic apparatus (scanner), the correction improving relative placement and/or size of a second (e.g., similar) second structure, with respect to the first structure, in a subsequently applied layer.

One problem with such an approach is that the actuation potential of the scanner may be limited and therefore it may not be possible to implement the determined corrections. By way of example, actuation of a focus correction across-slit is limited as the "slit cannot be bent", i.e., the focus cannot be directly varied non-linearly across the slit by a non-linear variation of distance between reticle and substrate stage. This is just one simple example, there are many reasons why a scanner cannot physically implement a desired correction, as the skilled person will recognize. The corrections determined for each layer will typically be different and therefore the degree to which the scanner can actuate each correction for each layer will also differ accordingly. In addition to this, different scanners may be used for different layers of the same stack and it is possible that the different scanners have different actuation capabilities compared to the scanner(s) used for the other layers.

It is therefore proposed to control the lithographic process by determining corrections which take into account the correction potential of the applicable lithographic apparatus (e.g., scanner) at each layer so as to maximize the probability that the final device will function. As before, such corrections may be based on metrology of previously completed stacks (e.g., using through-stack metrology techniques). Such a proposal may optimize layer alignment (e.g., CD matching quality, overlay or EPE) for all or a subset of layers in a stack simultaneously rather than individually optimizing placement of each layer to that of the immediately preceding layer. For example, where the subset of layers comprises two layers, instead of always determining corrections in terms of correcting the upper layer placement to the lower layer placement, the optimization may include optimizing placement of the two layers for best layer alignment, taking into account the correction potential of the lithographic apparatus (or respective lithographic apparatuses if different apparatuses are used to expose different layers). Such an optimization may result in a placement correction for the lower layer instead of, or in addition to, a placement correction for the upper layer, so as to maximize the probability that the final device will function. Such an approach can be applied to stacks of more than two layers, optimizing the placement of structures within these layers.

In an embodiment, the optimization may take into account one or more criticality metrics (e.g., an allowed variation range or process window) for each layer and/or for specific layer pairs. For example, it may be critical that a via layer, comprising contact holes, is properly aligned with a metal layer, comprising lines and spaces (i.e., the process window for placement of the via layer with respect to the metal layer is small). Such layers may be referred to as critical layers. As such, the optimization may be weighted in favor of ensuring good alignment of these two layers, potentially at the cost of one or more other, less critical layers having larger process windows, whether they be located lower or higher in the stack.

The correction may be determined by the lithographic apparatus or using a separate (e.g., offline) processing device, based on offline and/or inline measurements of processed substrates. The correction potential limitations will be known from prior knowledge of the machine actuation and/or observation. The determined corrections may comprise any type of position correction relating to formation of structures in two or more layers, and which may be subject to correction potential limitations in one or more of the layers. Such corrections may relate to one or more of: machine matching, reticle errors (e.g., reticle heating, reticle writing errors, reticle shape errors), lens heating, process corrections, focus and/or dose control and positional corrections of reticle and/or substrate stage. The corrections can then be fed back to the relevant lithographic apparatus(es) (or other apparatuses) for implementation in processing of further substrates.

Figure 5:
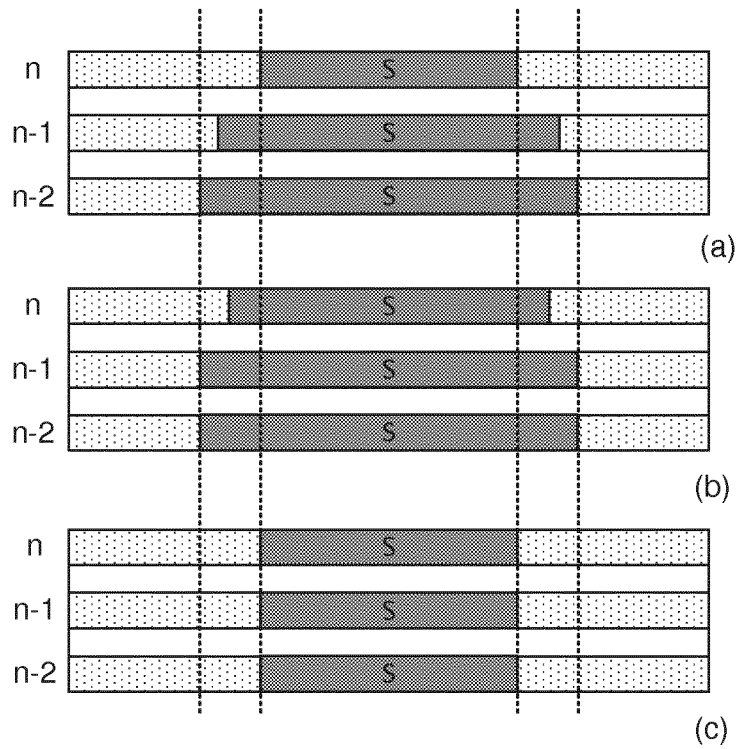
FIG. 5(a) schematically shows a stack comprising structures in three layers formed by a lithographic process without correction.
FIG. 5(b) schematically shows a stack comprising structures in three layers formed by a lithographic process using a conventional CD correction strategy.
FIG. 5(c) schematically shows a stack comprising structures in three layers formed by a lithographic process using a CD correction strategy, according to a first embodiment of the invention.

FIG. 5 shows an illustrative example of CD matching through three layers n-2, n-1, n formed by one or more lithographic apparatuses, and where the structures S in each layer are designed to have matched CD (i.e., good CD matching quality later-to-layer). FIG. 5(a) shows a nominal example where no CD matching quality correction is made between layers, where a CD matching quality correction aims to match the CD of corresponding structures in different layers. As a consequence, CD of the structures S in each of the layers is not uniform, with CD of the structures S varying significantly from layer to layer. FIG. 5(b) shows a more typical arrangement where a CD matching quality correction is made for placement of the top layer, with respect to the lower layer(s), as it is formed. In this example, the CD matching quality correction determined for layer n-1 when it was exposed onto layer n-2 was adequately actuated by the scanner. As such, CD matching quality between the structures S in layers n-2 and n-1 is good (i.e., the CD of these structures in well matched). However, in this example, the scanner has not been able to satisfactorily actuate the determined CD matching quality correction for layer n. As a result, the CD of the structure S in layer n is not well matched with respect to the structures S in the preceding layers n-2, n-1. It is important to note that, in this example, the lack of CD matching quality is not a result of the determined corrections being incorrect, but rather that the scanner actuation capability was such that the scanner could not fully implement the requested correction.

FIG. 5(c) shows the result of implementing a correction strategy as proposed herein. A CD matching quality correction in each layer n-2, n-1. n is calculated based on the actuation capability of the scanner or scanners used, in addition to measurements of previously manufactured/exposed structures. In this example, it is CD matching quality which is critical, rather than CD per se. Consequently, corrections are determined which optimize CD matching quality, but which are actuable by the (respective) scanner for each layer. This results in structures S of (more) uniform CD layer-to-layer, although this CD may be different to the designed CD (e.g., the CD of the structure S in layer n-2 in the examples of FIGS. 5(a) and 5(b)). As such, the correction has resulted in a CD matching quality correction being applied in all three layers, where the lower (earlier applied) layers are corrected with respect to the later (future applied) layers and vice versa.

Figure 6:
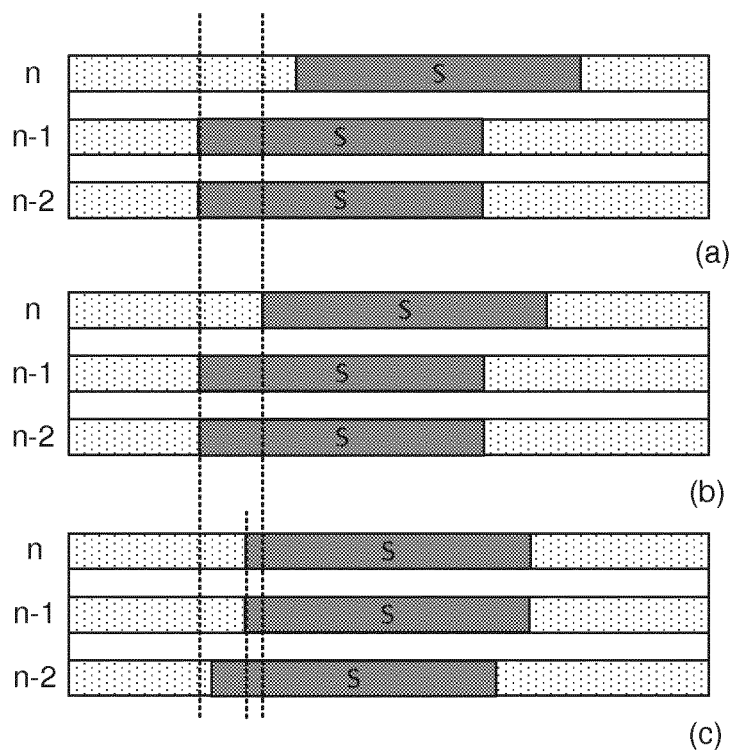
FIG. 6(a) schematically shows a stack comprising structures in three layers formed by a lithographic process without correction.
FIG. 6(b) schematically shows a stack comprising structures in three layers formed by a lithographic process using a conventional overlay correction strategy.
FIG. 6(c) schematically shows a stack comprising structures in three layers formed by a lithographic process using a correction overlay strategy, according to a second embodiment of the invention.

FIG. 6 shows a second example, in which the relevant matching parameter is overlay, and the structures S in each layer are designed to be aligned without any positional offset. FIG. 6(a) shows a nominal example where no overlay correction is applied in forming structure S in layer n. By comparison, FIG. 6(b) shows an example where a conventional overlay correction is applied in forming structure S in layer n. The conventional overlay correction attempts to align the structure S in layer n to the structure S already formed in layer n-1 (and therefore also layer n-2). However, due to the actuation limitations of the scanner, the determined correction has not been implemented with sufficient accuracy and the structures are not well aligned. Moreover, this alignment offset (i.e., overlay) is sufficiently large to not be within specification (e.g., outside of the corresponding process window for that layer). As such it may be assumed that the resultant device will be defective. As with the FIG. 5 example, the correction determined for layer n-1 was sufficiently actuated and overlay between layers n-2 and n-1 is within specification.

In this specific example, however, layer n is more critical than layer n-1. As such, alignment of layer n to layer n-1 is more critical, i.e., has a smaller process window, than alignment of layer n-2 to layer n-1. As the overlay of layer n is outside of the process window for that layer, the example shown in FIG. 6(b) is unacceptable in that it can be assumed that the positional offset (overlay error) between layers n and n-1 in FIG. 6(b) will result in the device being defective.

FIG. 6(c) shows the result of implementing a correction strategy as proposed herein. Here, the correction in each layer n-2, n-1. n is calculated based on the actuation capability of the scanner or scanners used (as in the FIG. 5 example) and, additionally, a relevant criticality metric (process window) for each layer. As before, the correction will also be based on measurements of previously manufactured/exposed structures to determine the error to be corrected.

In FIG. 6(c), the scanner actuable correction has resulted in a compromise alignment throughout the stack, with the optimizing favoring correction of overlay for layers n and n-1. As can be seen, this has actually resulted in a poorer overlay correction for layers n-2 and n-1 compared to using the conventional correction strategy illustrated in FIG. 6(b). However, alignment of these layers is less critical as the process window for this layer pair is larger than the equivalent process window for layer n with respect to layer n-1. Assuming that overlay is now within specification for all layer pairs, it can be assumed that this additional alignment offset in layer n-2 with respect to layer n-1 will not result in a defective device.

It will be readily appreciated that the concepts above may be combined such that edge placement is optimized (i.e., edge placement error is minimized) when determining the correction, optionally also applying a weighting to correspond with associated criticality metrics for each layer (or specific layers).

Figure 7:
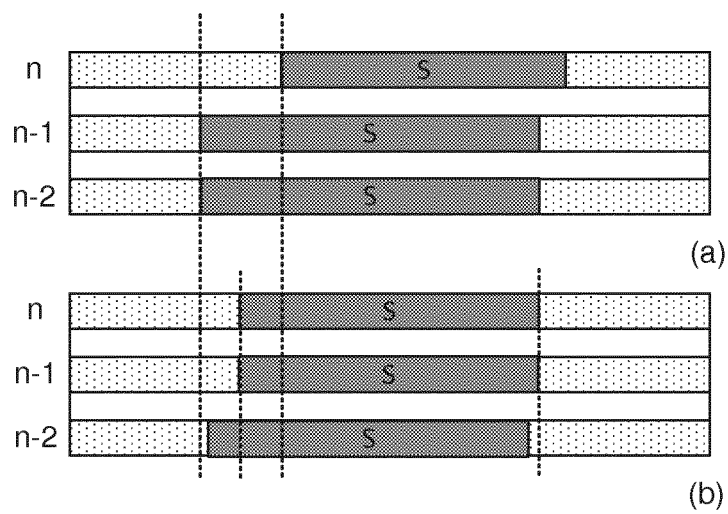
FIG. 7(a) schematically shows a stack comprising structures in three layers formed by a lithographic process using a conventional EPE correction strategy.
FIG. 7(b) schematically shows a stack comprising structures in three layers formed by a lithographic process using a EPE correction strategy, according to a third embodiment of the invention.

FIG. 7 shows a further example where the structures in each layer are designed to have uniform CD and be aligned (have zero positional offset/overlay). Also, in this example, matching of edge placement between structures S in layers n and n-1 is more critical than in layers n-1 and n-2. FIG. 7(a) shows the result of a conventional EPE correction strategy, where the scanner was able to effectively actuate the correction for layer n-1. but not for the subsequent layer n. As such, the structure S in layer n shows a significant edge placement error (overlay offset and CD mismatch) with respect to the structures S in the layers n-1. n-2. Because of the relevant criticality metric (process window), this device can be assumed defective. In FIG. 7(b) a correction strategy as proposed herein has been implemented. This has optimized edge placement through the stack taking into account the actuation potential of the scanner(s) and the relevant process windows. As such, optimization favored optimized placement of layer n with respect to layer n-1 over placement of layer n-1 with respect to layer n-2. As a result, edge placement error throughout the stack is now within specification for each layer and the device can be assumed to be functional. Note that there may be crosstalk in the actuation limitations with respect to overlay and CD (e.g., in the lens). Where this is the case, these actuation limitations may be balanced between overlay and CD matching quality in the optimization.

It should be appreciated that at least one layer may be applied by a different scanner to than that used to form the other layers, e.g., because that layer requires greater resolution then the other layers and/or to provide redundancy/flexibility in device manufacture. Where this is done, the machines should be matched, i.e., a correction should be determined for the two machines such that they mimic each other's fingerprints, thereby enabling either machine to be used for consecutive critical layers without introducing matching errors (errors resultant from differences in the machines' fingerprints). Such machine matching corrections are one of the corrections for which the concepts described herein are applicable.

In general, machine matching may comprise the matching of two (or more) machines' non-correctable fingerprints to determine which machines are best matched to each other (in the manufacturing of one or more layers on a substrate). For various reasons, a machine may need to be swapped with another (e.g., machine malfunction or a servicing requirement) during processing of a set of substrates. For example, substrates having one or more layers formed using a first machine may need one or more subsequent layers to be formed by a second machine if the first machine needs replacing. The non-correctable fingerprint errors imposed by the first machine will be compounded by different non-correctable fingerprint errors imposed by a second machine. Therefore, the second machine should be matched as closely as possible to the first machine in terms of non-correctable fingerprint contribution, otherwise the combined effect of both machines' fingerprints may result in loss of yield and requirement to re-work the substrates. By contrast, correctable fingerprints, by their nature, may be corrected for between machines by implementing suitable control corrections.

Presently, machine matching is performed using matching tables or maps which describe each machines' non-correctable fingerprint in only a single data domain, i.e., relating to a single performance parameter (e.g., only the overlay domain, or only the focus domain etc.). Also, present matching tables are based on relatively sparse metrology of monitor wafer exposures. Additionally, it is presently not possible to separate each domain contribution into contributions relating to specific components of each tool.

To address this, a method for matching lithographic apparatuses is described. The method comprises obtaining a first non-correctable component, for example comprised within computationally derived, high-density first measurement data associated with a first lithographic apparatus, obtaining an second non-correctable component, for example comprised within computationally derived, high-density second measurement data associated with a second lithographic apparatus; and determining, based on the first non-correctable component and second non-correctable component, a matching indicator which characterizes a quality of processing using the first lithographic apparatus and a second lithographic apparatus. In a particular embodiment, the first measurement data and second measurement data each comprise data relating to a plurality of different data domains, such that said matching indicator characterizes a quality of processing with respect to each of said plurality of data domains.

The computation metrology techniques herein can use a combination of data from a lithographic apparatus of the patterning process and data from a metrology apparatus to generate a derived contribution or fingerprint of a particular parameter of interest of the patterning process (e.g., overlay, edge placement error, etc.) for a substrate. So, in such a computational metrology application, hybrid-dense fingerprints of a particular parameter of interest are generated based on metrology and patterning process apparatus (e.g., lithographic apparatus) inputs. For example, for an overlay fingerprint, inputs can be, e.g., measurements made using one or monitor substrates, data or measurements from a patterning process manufacturing apparatus (e.g., a lithographic apparatus), and/or measurements (such as after-etch inspection (AEI) or after-development inspection (ADI) measurement results) from a metrology apparatus. Computational metrology enables characterization of fingerprints which could not be properly characterized using conventional (sparse) metrology (e.g., lens aberration fingerprints).

The proposed method comprises, for example, creating matching KPI(s) in a matching table based on input of all contributions in specific data domains, where some or all relevant domains may be included. All substrates can be used as input for the matching table. Machine matching can be performed cross-platform (e.g., for different machine types and models). The matching KPI can be expressed in all possible manners, for example as maps, numbers, time-sequences etc. Any maps can be expressed in high density grid. Furthermore, the proposed method is able to monitor machines and monitor substrates over time.

To provide a specific example, for each combination i,j of first machine i and second machine j being matched, the matching KPI $KPI_{scan_{i,j}}$ may be constructed by combining non-correctable machine fingerprints, relating to a number of data domains, for each machine. In an embodiment, the matching KPI $KPI_{scan_{i,j}}$ may comprise:

$$KPI_{scan_{i,j}} = \sqrt{OV_i^2 + OV_j^2 + F_i^2 + F_j^2 + E_i^2 + E_j^2 + \ldots + CD_i^2 + CD_j^2}$$

where OV is an overlay matching KPI F is a focus matching KPI, E is a dose matching KPI, and CD is a CD matching KPI; i.e., the data domains in this example are overlay, focus, dose and CD. These data domains are purely exemplary and more, fewer and/or a different combination of data domains may be included to determine the matching KPI. In addition, the specific combination method (root of sum of squares) is only exemplary and other combination methods may be used.

In an embodiment, the matching KPI may be determined per layer. This may be appropriate where one or more layers have different corresponding criticalities or process windows (e.g., as described in the first embodiment of determining a plurality of corrections. For example, the matching KPI may be determined specifically for layer combinations, e.g., for layers N and N+1, the matching $KPI_{layer_{N,N+1};scan_{i,j}}$ may comprise:

$$KPI_{layer_{N,N+1};scan_{i,j}} = \sqrt{OV_{Ni,N+1j}^2 + F_{Ni}^2 + F_{N+1j}^2 + E_{Ni}^2 + E_{N+1j}^2 + \ldots + CD_{Ni}^2 + CD_{N+1j}^2}$$

In each case, the contributory KPIs, from which the matching KPIs are determined (e.g., the overlay KPI) may be further decomposed into (or constructed from) specific machine component constituents. For example, the overlay KPI $OV_i$ for tool i may comprise:

$$OV_i = \sqrt{Met_i^2 + lensres_i^2 + topOV_i^2 \ldots}$$

where, in this example, $Met_i$ is the metrology fingerprint, $lensres_i$ is the lens residual fingerprint and $topOV_1$ is the topology induced overlay fingerprint. This is purely an example, the principle of which can be applied to the other data domains (in terms of the relevant components for each domain).

As such, the proposed method uses a comprehensive set of computationally derived data (dense data, including data from multiple domains; Overlay/Focus/CD etc.) per tool in order to determine (from a yield perspective) the optimal combination of scanners (e.g., a scanner matching table). The high density data largely relates to non-correctable components of the scanner contributions of interest (e.g. the data domains). Preferably, the data includes any metrology-to-device (MTD) offsets, so that the data better represents the performance on device features.

As an alternative, the non-correctable error fingerprint(s) may be determined per data domain and per machine, for all layers across a full stack. An across-stack yield indicator can then be determined for all possible (practical) combinations of machines across all layers. For example, a yield indicator yield(S0, S1, S2, . . . ) may be determined, where (purely for example) S0 describes any combination of machines 3 to 7 (layer 0), S1 describes any combination of machines 3 to 5 (layer 1), S2 describes any combination of machines 7 to 12 (layer 2). In this way, the best combination of machines for each layer in a stack, in terms of yield, becomes readily available.

In an embodiment, a (pre)-compensating correction strategy may be implemented. For example, where a correction capability is available in a first machine but not in a second machine, when determining a matching KPI for this combination of machines, the non-correctable fingerprint(s) of the second machine used to determine the matching KPI may take into account the possibility to perform a compensatory correction in the first machine.

Such a matching KPI strategy can result in an improvement of scanner control by better matching machines, and more accurate substrate description, resulting in an increased yield. There is a possibility to reduce metrology cost, relying more on computationally derived metrology data. In addition, a wafer table qualification test can be performed without compromising extra machine time. Also possible is a backside of substrate/degradation over time monitoring for matching purposes due to the high resolution data available.

As such, methods of controlling a lithographic apparatus are disclosed which comprise determining corrections based on the actuation potential of the lithographic apparatus for each layer. This means that correction of a particular layer is not only corrected to achieve optimal alignment with the previous layer (as is typical), but also to future (upper) layers, resulting in an overall better alignment of all features of the device. Such a method may comprise determining corrections which the applicable manufacturing apparatus is able to actuate satisfactorily. Determining whether a manufacturing apparatus is able to actuate a correction satisfactorily may be determined in a number of different ways and according to a number of different metrics. The determination may consider the result of the placement, overlay or CD matching quality (e.g., by modeling the result taking into account the actuation potential, or otherwise) and determine whether the result will be within specification. Alternatively or in addition, the determination may favor corrections which the applicable manufacturing apparatus is better able to actuate.

While the above description describes corrections for a lithographic apparatus/scanner, the determined corrections may also be used for any process and by any integrated circuit (IC) manufacturing apparatus in an IC manufacturing process, e.g., an etch apparatus, which has an effect on the position and/or a dimension of the structures formed within a layer.

Further embodiments of the invention are disclosed in the list of numbered embodiments below:

1. A method for determining a plurality of corrections for control of at least one manufacturing apparatus used in a manufacturing process for providing product structures to a substrate in a plurality of layers, wherein the plurality of layers comprises typically at least three layers, the method comprising:
determining the plurality of corrections comprising a correction for each layer, based on an actuation potential of the applicable manufacturing apparatus used in the formation of each layer 2.
A method according to embodiment 1, wherein determining a plurality of corrections based on an actuation potential of the applicable manufacturing apparatus comprises determining corrections which the applicable manufacturing apparatus is able to actuate satisfactorily.
3. A method according to embodiment 1 or 2, wherein said determination step comprises an optimization such that said plurality of corrections optimize the probability that the device will be functional.
4. A method according to any preceding embodiment, wherein said determining step comprises determining corrections for each layer simultaneously in terms of a matching parameter.
5. A method according to embodiment 4, wherein the matching parameter is overlay, critical dimension uniformity or edge placement error of the product structures.
6. A method according to embodiment 4 or 5, wherein said determining a plurality of corrections is further based on a criticality metric for one or more of said layers, said criticality metric relating to specification bounds for said matching parameter.
7. A method according to embodiment 6, wherein the criticality metric comprises a process window.
8. A method according to embodiment 6 or 7, wherein said determining step comprises applying a weighting imposing a relative importance to one or more of said corrections based on the criticality metric(s).
9. A method according to any preceding embodiment, wherein said corrections relate to one or more of: reticle heating, reticle writing, reticle shape, lens heating, process control, focus and/or dose control and positional control of a reticle stage and/or substrate stage of the applicable manufacturing apparatus.
10. A method according to any preceding embodiment, wherein a plurality of manufacturing devices are used in said manufacturing process such that at least one of said layers is applied using a different manufacturing device than the other layers and said corrections relate to machine matching.
11. A method according to embodiment 10, wherein said plurality of manufacturing devices comprise a first manufacturing device for manufacturing a first layer and a second manufacturing device for manufacturing a second layer, said method further comprising
obtaining a first non-correctable component, for example comprised within computationally derived, high-density first measurement data associated with the first manufacturing device;
obtaining a second non-correctable component, for example comprised within computationally derived, high-density second measurement data associated with the second manufacturing device; and
determining, based on the first non-correctable component and second non-correctable component, a matching indicator which characterizes a quality of processing using the first manufacturing device and the second manufacturing device.
12. The method of embodiment 11, wherein the first measurement data and second measurement data each comprise data relating to a plurality of different data domains, such that said matching indicator characterizes a quality of processing with respect to each of said plurality of data domains.
13. The method of embodiment 12, wherein said plurality of data domains comprise two or more of overlay, focus, critical dimension, any other dimension, dose.
14. The method of embodiment 12 or 13, wherein said matching indicator comprises a combination of contributory indicators determined from the first non-correctable component and second non-correctable component, said combination comprising a contributory indicator for each data domain.
15. The method of embodiment 14, k wherein one or more of the contributory indicators comprises separately determined lithographic apparatus component contributions, each relating to a specific component of the lithographic apparatus.
16. The method of any of embodiments 11 to 15, comprising determining a matching indicator for different combinations of first lithographic apparatuses and second lithographic apparatuses from a plurality of lithographic apparatuses greater than two.

17. The method of embodiment 16, comprising deciding which lithographic apparatus should replace another lithographic apparatus based on said matching indicators for different combinations.
18. The method of embodiment 16 or 17, wherein said obtaining and determining a matching indicator steps are performed per layer to determine one or more layer-specific matching indicators.
19. The method of any of embodiments 11 to 16, wherein said matching indicator comprises an across-stack yield indicator for all layers for different combinations of lithographic apparatuses.
20. A method according to any preceding embodiment, wherein said determining a plurality of corrections is further based on measurements performed on similar product structures formed in a previous manufacturing process, to determine the error to be corrected by said corrections.
21. A method according to any preceding embodiment, wherein determining a plurality of corrections based on an actuation potential of the applicable manufacturing apparatus comprises favoring corrections which the applicable manufacturing apparatus is better able to actuate.
22. A method according to any preceding embodiment, comprising controlling the manufacturing process using said corrections.
23. A processing device for determining corrections for control of at least one manufacturing apparatus configured to provide product structures to a substrate in a plurality of layers in a manufacturing process, the processing device being configured to perform the method of any of embodiments 1 to 21.
24. A manufacturing apparatus configured to provide product structures to a substrate in a manufacturing process, said manufacturing apparatus comprising the processing device according to embodiment 23.
25. A manufacturing apparatus according to embodiment 24, wherein the manufacturing apparatus comprises a lithographic apparatus having:
a substrate stage for holding a substrate;
a reticle stage for holding a patterning device;
a processor operable to control a manufacturing process using said plurality of corrections.
26. A method for matching lithographic apparatuses comprising:
obtaining a first non-correctable component comprised within computationally derived, high-density first measurement data associated with a first lithographic apparatus;
obtaining a second non-correctable component comprised within computationally derived, high-density second measurement data associated with a second lithographic apparatus; and
determining, based on the first non-correctable component and second non-correctable component, a matching indicator which characterizes a quality of processing using the first lithographic apparatus and the second lithographic apparatus.
27. The method of embodiment 26, wherein the first measurement data and second measurement data each comprise data relating to a plurality of different data domains, such that said matching indicator characterizes a quality of processing with respect to each of said plurality of data domains.
28. The method of embodiment 27, wherein said plurality of data domains comprise two or more of overlay, focus, critical dimension, any other dimension, dose.
29. The method of embodiment 28 or 29, wherein said matching indicator comprises a combination of contributory indicators determined from the first non-correctable component and second non-correctable component, said combination comprising a contributory indicator for each data domain.
30. The method of embodiment 29, wherein said contributory indicators are combined as a root of sum of squares.
31. The method of embodiment 29 or 30, wherein one or more of the contributory indicators comprises separately determined lithographic apparatus component contributions, each relating to a specific component of the lithographic apparatus.
32. The method of any of embodiments 27 to 31, comprising determining a matching indicator for different combinations of first lithographic apparatuses and second lithographic apparatuses from a plurality of lithographic apparatuses greater than two.
33. The method of embodiment 32, comprising deciding which lithographic apparatus should replace another lithographic apparatus based on said matching indicators for different combinations.
34. The method of embodiment 32 or 33, wherein said obtaining and determining a matching indicator steps are performed per layer to determine one or more layer-specific matching indicators.
35. The method of any of embodiments 27 to 33, wherein said matching indicator comprises an across-stack yield indicator for all layers for different combinations of lithographic apparatuses.
36. The method of any of embodiments 27 to 35, wherein said first lithographic apparatus comprises a correction capability which is not comprised in said second lithographic apparatus, and said method comprises taking into account the possibility to perform a compensatory correction using the correction capability of the first lithographic apparatus when determining said matching indicator.
37. A computer program comprising program instructions operable to perform the method of any of embodiments 1 to 22 and 27 to 36 when run on a suitable apparatus.
38. A non-transient computer program carrier comprising the computer program of embodiment 37.
39. A method according to embodiment 10, wherein said plurality of manufacturing devices comprise a first manufacturing device for manufacturing a first layer and a second manufacturing device for manufacturing a second layer, said method further comprising
obtaining a first non-correctable component associated with the first manufacturing device;
obtaining a second non-correctable component associated with the second manufacturing device; and
determining, based on the first non-correctable component and second non-correctable component, a matching indicator which characterizes a quality of processing using the first manufacturing device and the second manufacturing device.
40. A method according to embodiment 39, wherein the first non-correctable component is comprised within computationally derived, high-density first measurement data associated with the first manufacturing device and the second non-correctable component is comprised within computationally derived, high-density second measurement data associated with the second manufacturing device.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for determining a plurality of corrections for control of at least one manufacturing apparatus used in a manufacturing process for providing product structures to a substrate in a plurality of layers, the method comprising:
    determining the plurality of corrections comprising a correction for each layer, based on an actuation potential of the applicable manufacturing apparatus used in the formation of each layer, wherein the determining comprises simultaneously determining, by a hardware computer system, corrections for each layer in terms of a matching parameter.

2. The method according to claim 1, wherein the matching parameter is one or more selected from: overlay, critical dimension uniformity or edge placement error of the product structures.

3. The method according to claim 1, wherein the determining a plurality of corrections is further based on a criticality metric for one or more of the layers, the criticality metric relating to specification bounds for the matching parameter.

4. The method according to claim 1, wherein the corrections relate to one or more selected from: reticle heating, reticle writing, reticle shape, lens heating, process control, focus and/or dose control, and/or positional control of a reticle stage and/or substrate stage of the applicable manufacturing apparatus.

5. The method according to claim 1, wherein a plurality of manufacturing devices are used in the manufacturing process such that at least one of the layers is applied using a different manufacturing device than the other layers and the corrections relate to machine matching.

6. The method according to claim 5, wherein the plurality of manufacturing devices comprise a first manufacturing device for manufacturing a first layer and a second manufacturing device for manufacturing a second layer, the method further comprising:
    obtaining a first non-correctable component associated with the first manufacturing device;
    obtaining a second non-correctable component associated with the second manufacturing device; and
    determining, based on the first non-correctable component and second non-correctable component, a matching indicator which characterizes a quality of processing using the first manufacturing device and the second manufacturing device.

7. The method according to claim 6, comprising determining a matching indicator for different combinations of first lithographic apparatuses and second lithographic apparatuses from a plurality of lithographic apparatuses greater than two.

8. The method according to claim 7, further comprising deciding which lithographic apparatus should replace another lithographic apparatus based on the matching indicators for different combinations.

9. The method according to claim 6, wherein the obtaining and determining a matching indicator are performed per layer to determine one or more layer-specific matching indicators.

10. The method according to claim 6, wherein the matching indicator comprises an across-stack yield indicator for all layers for different combinations of lithographic apparatuses.

11. The method according to claim 6, wherein the first manufacturing device is operable at a deep ultraviolet (DUV) wavelength and the second manufacturing device is operable at an extreme ultraviolet (EUV) wavelength.

12. The method according to claim 6, wherein the first non-correctable component is comprised within computationally derived, high-density first measurement data associated with the first manufacturing device and the second non-correctable component is comprised within computationally derived, high-density second measurement data associated with the second manufacturing device.

13. The method according to claim 12, wherein the first measurement data and second measurement data each comprise data relating to a plurality of different data domains, such that the matching indicator characterizes a quality of processing with respect to each of the plurality of data domains.

14. The method according to claim 13, wherein the plurality of data domains comprise two or more selected from: overlay, focus, critical dimension, any other dimension, and/or dose.

15. The method according to claim 13, wherein the matching indicator comprises a combination of contributory indicators determined from the first non-correctable component and second non-correctable component, the combination comprising a contributory indicator for each data domain.

16. A method for matching lithographic apparatuses, the method comprising:
    obtaining a first component comprised within, computationally derived, first measurement data associated with a first lithographic apparatus, the first component identified as being non-correctable by the first lithographic apparatus;
    obtaining a second component comprised within, computationally derived, second measurement data associated with a second lithographic apparatus, the second component identified as being non-correctable by the second lithographic apparatus; and
    determining, by a hardware computer and based on the first non-correctable component and on the second non-correctable component, a matching indicator which characterizes a quality of processing using the first lithographic apparatus and the second lithographic apparatus.

17. The method of claim 16, wherein the first measurement data and second measurement data each comprise data relating to a plurality of different data domains, such that the matching indicator characterizes a quality of processing with respect to each of the plurality of data domains.

18. The method of claim 16, wherein the first lithographic apparatus comprises a correction capability which is not comprised in the second lithographic apparatus, and the method comprises taking into account the possibility to perform a compensatory correction using the correction capability of the first lithographic apparatus when determining the matching indicator.

19. A non-transitory computer program product comprising program instructions, the instructions, when executed by a computer system, configured to cause the computer system to at least determine a plurality of corrections for control of at least one manufacturing apparatus used in a manufacturing process for providing product structures to a substrate in a plurality of layers, the plurality of corrections comprising a correction for each layer, based on an actuation potential of the applicable manufacturing apparatus used in the formation of each layer, wherein the determination of the plurality of corrections comprises simultaneous determination of corrections for each layer simultaneously in terms of a matching parameter.

20. A non-transitory computer program product comprising program instructions, the instructions, when executed by a computer system, configured to cause the computer system to at least:
- obtain a first component comprised within, computationally derived, first measurement data associated with a first lithographic apparatus, the first component identified as being non-correctable by the first lithographic apparatus;
- obtain a second component comprised within, computationally derived, second measurement data associated with a second lithographic apparatus, the second component identified as being non-correctable by the second lithographic apparatus; and
- determine, based on the first non-correctable component and on the second non-correctable component, a matching indicator which characterizes a quality of processing using the first lithographic apparatus and the second lithographic apparatus.

* * * * *